United States Patent
Cox et al.

(10) Patent No.: US 7,380,053 B2
(45) Date of Patent: May 27, 2008

(54) METHOD AND SYSTEM FOR EMULATING CONTENT-ADDRESSABLE MEMORY PRIMITIVES

(75) Inventors: Charles Edwin Cox, San Jose, CA (US); Jimmy Lee Reaves, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 434 days.

(21) Appl. No.: 11/083,209

(22) Filed: Mar. 17, 2005

(65) Prior Publication Data

US 2006/0212648 A1   Sep. 21, 2006

(51) Int. Cl.
*G06F 12/00* (2006.01)
(52) U.S. Cl. ........................ 711/108; 711/104
(58) Field of Classification Search ............... None
See application file for complete search history.

(56) References Cited

U.S. PATENT DOCUMENTS

| | | |
|---|---|---|
| 6,344,989 B1 | 2/2002 | Heile |
| 6,351,143 B1 | 2/2002 | Guccione et al. |
| 6,353,332 B1 | 3/2002 | Brelet |
| 6,754,766 B1 | 6/2004 | Schlacter |
| 6,781,857 B1 | 8/2004 | Lien et al. |

OTHER PUBLICATIONS

Lattice Semiconductor Corporation, *Content Addressable Memory (CAM) Applications for ispXPLD™ Devices*; AN8071; Jul. 2002; pp. 1-9.

Brelet, Jean-Louis, XILINX, *An Overview of Multiple CAM Designs in Virtex Family Devices*; XAPP 201, Sep. 23, 1999 (v1.1); pp. 1-6.

Defossez, Marc, XILINX, *Content Addressable Memory (CAM) in ATM Applications*; XAPP202, Sep. 23, 1999 (v1.1); pp. 1-14.

Brelet, Jean-Louis and New, Bernie, XILINX, *Designing Flexible, Fast CAMs with Virtex Family FPGAs*; XAPP203, Sep. 23, 1999 (v1.1); pp. 1-17.

Brelet, Jean-Louis, XILINX, *Using Block RAM for High Performance Read/Write CAMs*; XAPP204, May 2, 2000 (v1.2); pp. 1-19.

Brelet, Jean-Louis and Gopalakrishnan, Lakshmi, XILINX, *Using Virtex-II Block RAM for High Performance Read/Write CAMs*; XAPP260, Feb. 27, 2002 (v1.1); pp. 1-12.

*Primary Examiner*—Reginald G. Bragdon
*Assistant Examiner*—Mehdi Namazi
(74) *Attorney, Agent, or Firm*—Dillon & Yudell, LLP

(57) ABSTRACT

A method and system for emulating content-addressable memory (CAM) primitives (e.g., a read operation) is disclosed. According to one embodiment, a method is provided for emulating a read operation on a plurality of CAM elements utilizing a read input including match input data and a CAM element selection index. In the described method, match reference data is distributed among a plurality of random-access memory (RAM) elements by storing match reference data corresponding to each of the plurality of CAM elements within a first RAM element of the plurality. Thereafter, a first record is identified within the first RAM element utilizing a first portion of the match input data and the CAM element selection index. A read operation result is then generated utilizing the first record.

5 Claims, 4 Drawing Sheets

METHOD AND SYSTEM FOR EMULATING CONTENT-ADDRESSABLE MEMORY PRIMITIVES

BACKGROUND

1. Technical Field

Embodiments of the present invention relate generally to data processing system memory resources and more particularly to a method and system for emulating content-addressable memory primitives.

2. Description of the Related Art

In a conventional data processing system, data and instructions are stored within memory storage elements arranged in a hierarchical structure. In a typical hierarchical memory or storage structure, smaller, faster memory elements are located closer (in terms of physical structure) and more tightly coupled (communicatively) to processing elements (e.g., processors or processor cores) and store a subset of data and/or instructions stored in larger, slower memory elements (e.g., fixed or removable magnetic or optical disks, tape storage, or the like) elsewhere within or coupled to the data processing system. One type of memory element used frequently in data processing systems for so-called "main" or system memory is random-access memory.

In a conventional random-access memory or "RAM" element, data values are stored in an array of addressed memory locations. To perform a read operation on a RAM element, an address (e.g., a data processing system memory address) is applied to the RAM element, causing data stored at the applied address to be accessed and presented by the RAM.

In order to determine whether a particular data value is stored within a RAM element, an address-based data searching method is performed in which data values are sequentially read out from the RAM and compared with the searched-for data value. Specifically, a series of addresses are sequentially transmitted to an address port of the RAM, thereby causing data values to be read out from the memory locations addressed. A separate comparator element is then used to compare each of the output data values with the searched-for data value, generating a signal when a match occurs. When a large number of data values is to be searched or compared, such address-based search operations are very time consuming as only a single data value is typically processed each clock cycle.

Another type of memory element used in data processing systems to perform data search or comparison operations is content-addressable memory. In a content-addressable memory (CAM) element, a data value may be searched by content, rather than address. In a conventional CAM, data values are stored such that each data value is assigned to a row or column of an array of storage cells. To determine whether a particular data value is stored in a CAM element, a content-based data match operation is performed in which a searched-for data value is simultaneously compared with all rows/columns containing the pre-loaded data values. When one or more of the pre-loaded data values matches the searched-for data value, a "match" signal is generated by the CAM element, along with an address indicating the storage location (i.e., row or column) of the matching pre-loaded data value.

By simultaneously comparing searched-for data with several pre-loaded data values, a CAM element is able to perform comparison or matching operations involving several pre-loaded data values in a single clock cycle. Consequently, CAM elements significantly reduce the time needed to identify a specific data value within a large amount of data as compared with conventional RAM elements and are used frequently for search or pattern-matching-intensive applications. FIG. 1 illustrates a data processing system processor cache as one such exemplary application. The depicted data processing system processor cache 100 includes a cache memory element 102 coupled to a cache tag lookup element 104 as shown. For purposes of illustration, data processing system processor cache 100 will be described herein as a 32 kilobyte cache having 1024 lines of 32 bytes each and organized as a 64-way set associative cache including 16 sets.

Data processing system processor cache 100, as depicted in FIG. 1, is addressed using a 32 bit address with bits 0 through 4 (represented as bits 4:0) identifying a specific byte within a cache line, bits 5 through 8 (represented as bits 8:5) identifying a specific set of the 16 possible sets, and remaining bits (represented as bits 31:9) making up a "cache tag" which identifies a block-frame address in memory where the cache line resides. In a conventional cache memory, a cache tag is used to verify that the cache line addressed in fact stores the requested data.

Cache tag lookup element 104 includes a number of CAM elements 106A, 106B, . . . 106N coupled to a multiplexer 108 and to a match indication signal generation element, (e.g., OR gate 110). In the illustrated data processing system processor cache 100, 16 CAM elements 106 (one for each cache "set") are employed. In operation, a cache tag (e.g., bits 31:9 of a data processing system memory address) is applied simultaneously to each of CAM elements 106A-106N. Each of CAM elements 106A-106N in the illustrated processor cache is a 64×23 CAM including 64 23-bit registers (not illustrated) coupled to 64 comparators which are in turn coupled to encoding logic (not illustrated). Within the present description, the variable "N" is intended to indicate some positive integer value and need not indicate the same value consistently.

The encoding logic (not illustrated) of each of CAM elements 106 is used to generate a 6-bit address corresponding to a matching CAM element record. Each CAM element 106 is additionally coupled to OR gate 110 to generate a match indication signal indicating whether or not a matching record was identified. Each 6-bit CAM element address generated is then applied, along with a cache set index (e.g., bits 8:5 of the received data processing system memory address), to multiplexer 108. Multiplexer 108 outputs a selected input 6-bit address specified by the received cache set index. The output of multiplexer 108 is then combined/concatenated with the cache set index to form a 10-bit cache memory element address as shown. The generated 10-bit cache memory element address is then used to address or identify a 256-bit line or "block" within cache memory element 102.

While CAM elements are well-suited for performing comparison operations such as those required by cache tag lookup element 104, CAMs may not be implemented in some cases or may be prohibitively expensive in some cases where they may otherwise be used. One technique for providing basic CAM functionality or "primitives" is to emulate the operation of a CAM element using one or more RAM elements. FIG. 2 illustrates a conventional RAM-based emulated CAM. The "virtual" or emulated CAM element 200 depicted in FIG. 2 may be substituted for one of the individual CAM elements 106A-106N illustrated in FIG. 1 and its functionality, as applied for performing a portion of a cache tag lookup operation, will be described with respect to data processing system processor cache 100 of that figure. As represented in FIG. 2, emulated CAM 200 includes RAM elements 202A, 202B, and 202C coupled with combinatorial (e.g., AND gate 204 and OR gate 206) and encoding (e.g., encoder 208) logic as shown.

Each RAM element 202 may be viewed as a 2-dimensional array of bits including rows corresponding to each of the 64 ways of a cache memory element being accessed. Each row stores match reference data for a portion of a cache tag associated with the row's way and represented as a vector of bits. Accordingly, a 7-bit cache tag portion is represented using a $2^7$-bit vector "one-hot" encoded to indicate, using a single hit value, which of the 128 possible cache tag portion permutations is stored within that row/way. Similarly, an 8-bit cache tag portion is represented using a $2^8$ or 256-bit vector.

In operation, emulated CAM 200, and associated RAM elements 202, are utilized to perform a "split" lookup function in which separate portions (e.g., a 7-bit portion and 2 8-bit portions) of a cache tag are each used to address a corresponding one of RAM elements 202. A match of a complete cache tag is indicated if each portion of the cache tag matches in the same way of each of RAM elements 202 and consequently of the cache. For purposes of clarity, illustration of a write port (and a corresponding description of a write operation) has been omitted from emulated CAM 200 of FIG. 2. Each cache tag portion identifies or addresses a single bit position which may be viewed a column within an accessed RAM element including a bit from each way. All 64 bits of that bit position or column are then output to determine whether the provided or input partial cache tag value matched reference partial cache tag data within the corresponding portion of the emulated CAM (indicated, for example, by a single bit having a logical "1" value).

The 64-bit outputs of each of RAM elements 202A-202C are then logically combined or "joined" via a bitwise AND operation using AND gate 204. The combined 64-bit output is then used to generate a 6-bit match address corresponding to a matching location within emulated CAM element 200 (e.g., using encoder 208) and to generate a match indication signal indicating whether or not a matching record was identified (e.g., using OR gate 206) as shown. If none of the bits of the bitwise-coalesced RAM element output is set to a logical "1" value, a determination may be made that the complete 23-bit input cache tag failed to match an emulated CAM element entry for a single way of an associated cache memory element. Once the 6-bit match address and match indication signal have been generated, they may be applied, along with a CAM selection (e.g., cache set) index, to a multiplexer (e.g., multiplexer 108 of FIG. 1) and used to address a cache memory element as previously described herein.

While RAM element-based CAM emulation may be utilized in some circumstances where traditional CAMs may not, providing greater flexibility and cost-effectiveness, one significant problem associated with such CAM emulation techniques is the quantity of RAM memory required for implementation. This problem, although more prominent where emulation of a CAM element is embodied in a single RAM, is evident even where emulation is distributed across multiple RAM elements as depicted in FIG. 2. For example, for a 32 kilobyte cache as described herein, at least 640 kilobits of RAM storage (approximately 40 kilobits of RAM storage for each of a total of 16 emulated CAM elements) is required.

Additional RAM storage may also be required as a buffer for match reference data used to update or modify match reference data within the emulated CAM's RAM elements. Moreover, logic used in conventional CAM-based implementations (e.g., a multiplexer and an additional OR gate used to generate a global match indication signal) is not eliminated in such CAM-emulation systems. In some circumstances this quantity of memory and logic is unacceptable and consequently a cache may be omitted or implemented in a less-than-optimal way.

SUMMARY

A method and system are provided for emulating content-addressable memory (CAM) primitives (e.g., a read operation). According to one embodiment, a method is provided for emulating a read operation on a plurality of CAM elements using a read input including match input data and a CAM element selection index. In the described method, match reference data is distributed among a plurality of random-access memory (RAM) elements by storing match reference data corresponding to each of the plurality of CAM elements within a first RAM element of the plurality. Thereafter, a first record is identified within the first RAM element using a first portion of the match input data and the CAM element selection index. A read operation result is then generated using the first record.

The foregoing is a summary and thus contains, by necessity, simplifications, generalizations and omissions of detail; consequently, those skilled in the art will appreciate that the summary is illustrative only and is not intended to be in any way limiting. As will also be apparent to one of skill in the art, the operations disclosed herein may be implemented in a number of ways including implementation in hardware using a variety of techniques. For example, implementations of the present invention may be provided using application-specific integrated circuits (ASICs) or other special-purpose electronic circuits as well as programmable logic devices (PLDs) such as field-programmable gate arrays (FPGAs), programmable logic arrays (PLAs) or the like. Such changes and modifications may be made without departing from this invention and its broader aspects. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous features and advantages made apparent to those skilled in the art by referencing the accompanying drawings in which.

The use of the same reference symbols in different drawings is intended to indicate similar or identical items.

DETAILED DESCRIPTION OF AN ILLUSTRATIVE EMBODIMENT

The following description and its accompanying figures sets forth embodiments for carrying out one or more method, systems, and/or devices of the present invention. This description is intended to be illustrative rather than restrictive and should not be taken to be limiting. More specifically, in the following detailed description, numerous specific details such as specific method orders, structures, elements, and connections have been set forth. It is to be understood however that these and other specific details need not be utilized to practice embodiments of the present invention. In other circumstances, well-known structures, elements, or connections have been omitted, or have not been described in particular detail in order to avoid unnecessarily obscuring the described invention embodiments.

References within the present description to "embodiments", "one embodiment" or "an embodiment" are intended to indicate that a particular feature, structure, or characteristic described in connection with the embodiment is included in at least one embodiment of the present invention. The appearance of the phrase "in one embodiment" in various places within the specification are not necessarily all referring to the same embodiment, nor are separate or alternative embodiments mutually exclusive. Moreover, various features are described which may be exhibited by some embodiments and not by others. Similarly, various requirements may be described which are requirements for some embodiments but not other embodiments.

Embodiments of the present invention provide a method and system for emulating content-addressable memory (CAM) primitives (e.g., a read operation) within a data processing system. According to one embodiment, a method is provided for emulating a read operation on a plurality of content-addressable memory elements utilizing a read input (e.g., a data processing system memory address), where the read input includes match input data (e.g., a cache tag) and a content-addressable memory element selection index (e.g., a cache set index).

In the described method embodiment, match reference data corresponding to each of the emulated CAM elements is distributed among a number of RAM elements. The match reference data is stored as portions of "one-hot" encoded match reference data within at least a first and second RAM element of the RAM elements used for CAM emulation. Records within the first and second RAM elements are then identified using first and second portions of the read input, respectively, along with the CAM element selection index. The identified records are then used to generate an emulated CAM read operation result (e.g., a match indication signal and/or match address).

Figure 1:
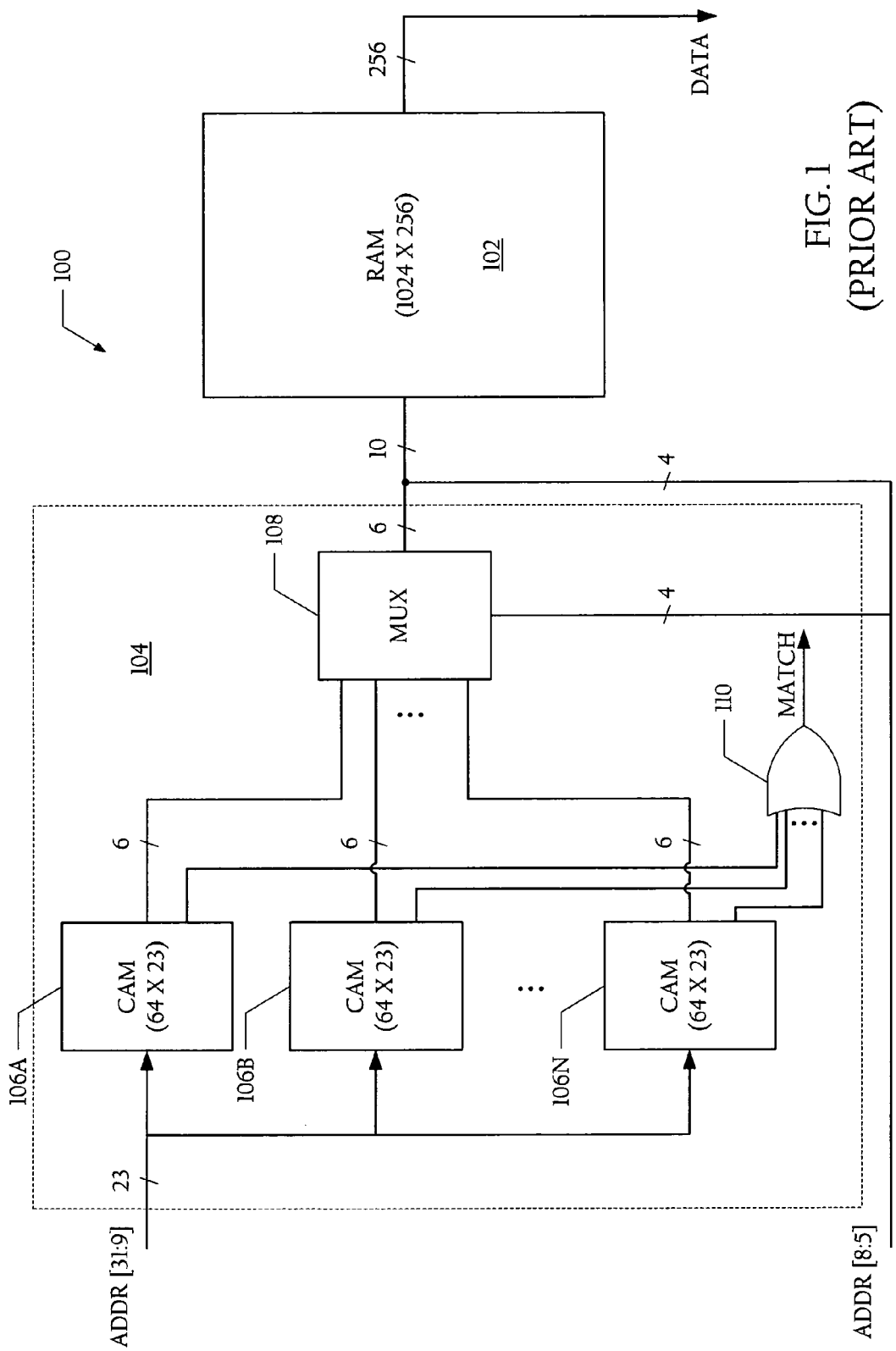
FIG. 1 illustrates a data processing system processor cache including a conventional content-addressable memory-based cache tag lookup element.
Figure 2:
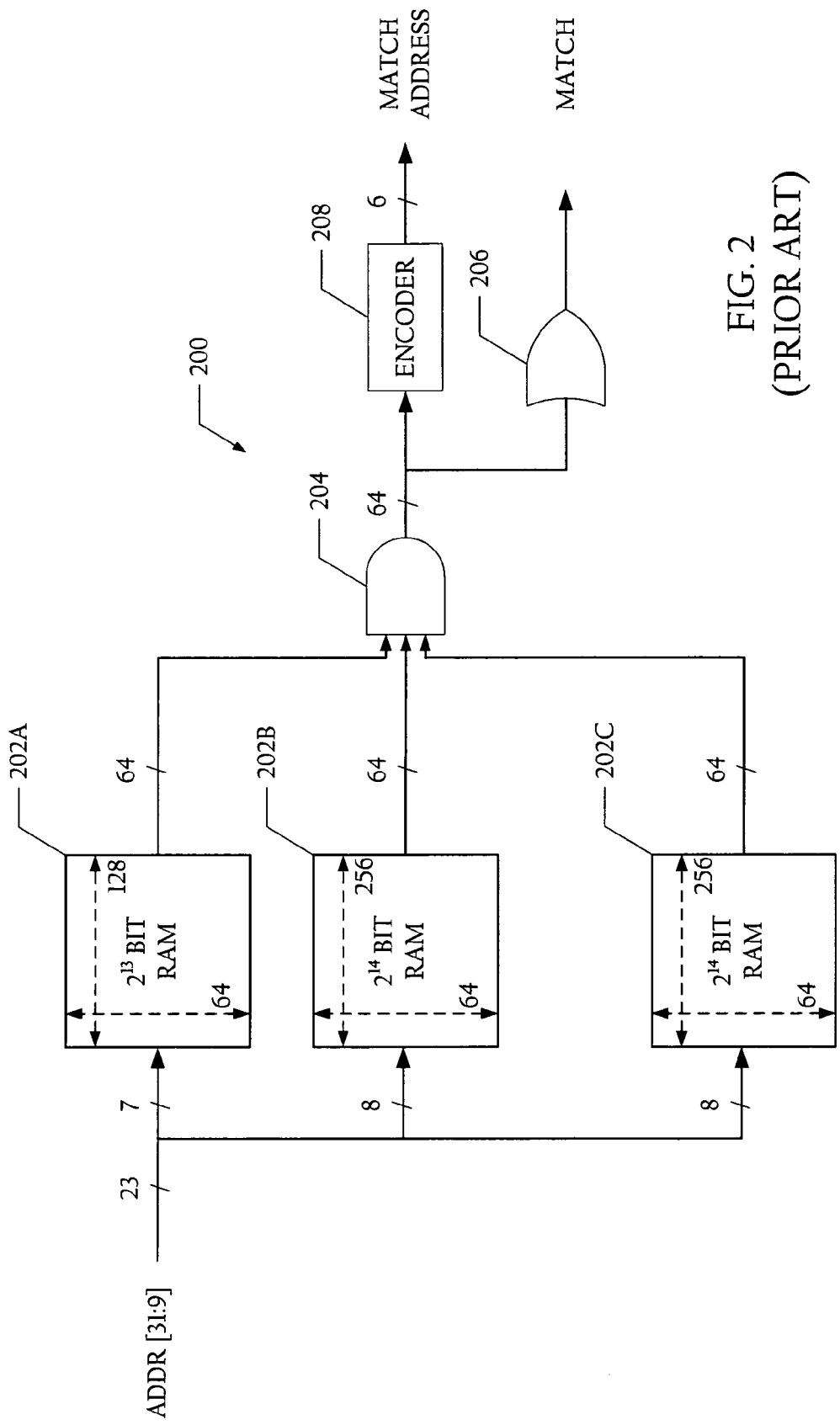
FIG. 2 illustrates a conventional RAM-based emulated CAM element.
Figure 3:
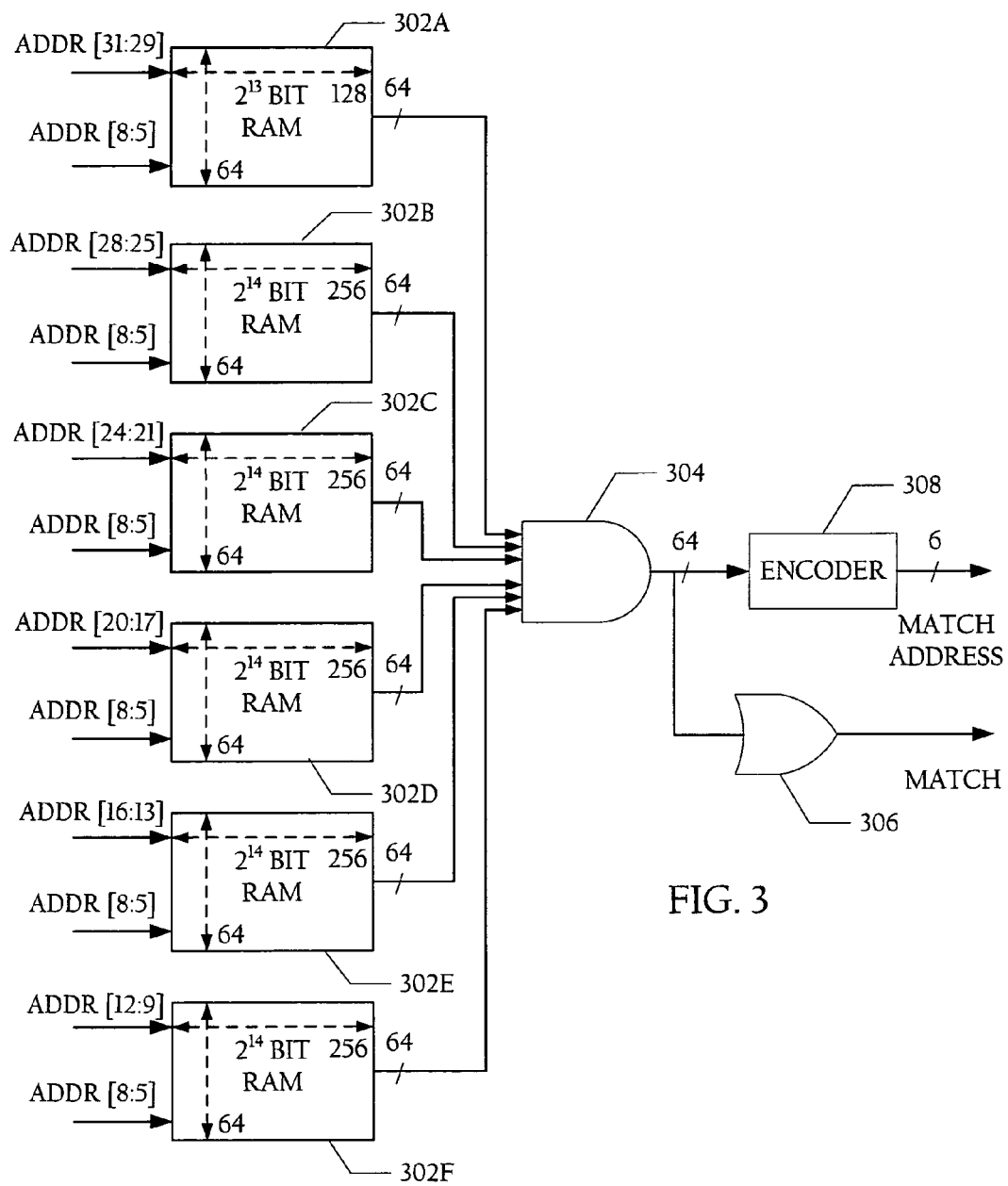
FIG. 3 illustrates a RAM-based emulated CAM element according to an embodiment of the present invention.

FIG. 3 illustrates a RAM-based emulated CAM element according to an embodiment of the present invention. As distinguished from conventional RAM-based CAM emulation systems, the "virtual" or emulated CAM element 300 depicted in FIG. 3 may be used in place of a plurality of traditional CAM elements rather than a single CAM element of a group. The functionality of emulated CAM element 300, as applied for performing a portion of a cache tag lookup operation, will now be described with respect to data processing system processor cache 100 as illustrated in, and described with respect to, FIG. 1. Emulated CAM 300 of the illustrated embodiment includes RAM elements 302A-302F coupled with combinatorial (e.g., AND gate 304 and OR gate 306) and encoding (e.g., encoder 308) logic as shown.

Each RAM element 302 may be viewed as a 2-dimensional array of bits including rows corresponding to each of the 64 ways of a cache memory element being accessed. Unlike a conventional RAM-based emulated CAM element however, each RAM element row stores match reference data (e.g., a "one-hot" encoded bit vector) for a portion of a cache tag associated with the row's associated way as well as for each CAM of the plurality of CAMs being emulated. In other words, each row of RAM elements 302 stores match reference data corresponding to a portion of a cache tag and to all "sets" of a set-associative cache upon which emulated CAM element 300 is used to perform a cache tag lookup operation.

By exploiting the set associativity of a cache and storing match reference data corresponding to each cache "set" within each RAM element used, the size of each RAM element 302 is increased but the total number of RAM elements 302 used is decreased as compared to conventional multiple-CAM element systems. Accordingly, a smaller number of bits of total storage capacity is required. In operation, emulated CAM 300 and associated RAM elements 302 are utilized to perform a "split" lookup function in which separate portions (e.g., a 3-bit portion and 5 4-bit portions) of a cache tag along with a cache set index are used to address each of RAM elements 302. A match of a complete cache tag is indicated if each portion of the cache tag matches in the same way and set of the cache as determined using the match reference data distributed among RAM elements 302.

For purposes of clarity, illustration of a write port has been omitted from emulated CAM element 300 of FIG. 3. In one embodiment of the present invention however, a separate RAM element is used to store prior match reference data (e.g., in encoded form) which is used to identify specific bits to be cleared or "reset" prior to an update or write operation to the match reference data stored within RAM elements 302. In emulated CAM element 300, each cache tag portion is used, along with associated cache set index data, to identify or address a single bit position. Each bit position may be viewed as a column within an accessed RAM element including a bit from each way of an associated cache. All 64 bits of that bit position or column are then used to determine whether the provided or input partial cache tag value matched reference partial cache tag data within a specified set of a corresponding RAM element 302 of emulated CAM 300 (indicated, for example, by a single bit having a logical "1" value).

The 64-bit outputs of each of RAM elements 302A-302F are then logically combined or "joined" via a bitwise AND operation using AND gate 304. The combined 64-bit output may then be used to generate a 6-bit match address corresponding to a matching emulated CAM element record (e.g., using encoder 308) and a match indication signal indicating whether or not a matching record was identified (e.g., using OR gate 306). If none of the bits of the bitwise-coalesced RAM element output is set to a logical "1" value, a determination may be made that the complete 23-bit input cache tag failed to match an emulated CAM element entry for a single way and set of an associated cache memory element.

According to one embodiment of the present invention, emulated CAM element 300 may be implemented using conventional RAM elements coupled with data processing system software or combinatorial logic. Such combinatorial logic may be implemented using discrete elements or a programmable logic device (PLD). In another embodiment, emulated CAM element 300 may be implemented using a PLD. For example, emulated CAM 300 may comprise one or more field programmable gate array (FPGA) elements such as a Virtex™-II FPGA device, provided by Xilinx Corporation of San Jose, Calif. Moreover, although individual RAM elements are depicted with respect to the described embodiments, a single RAM element partitioned into multiple storage areas may be similarly employed in alternative embodiments of the invention.

Figure 4:
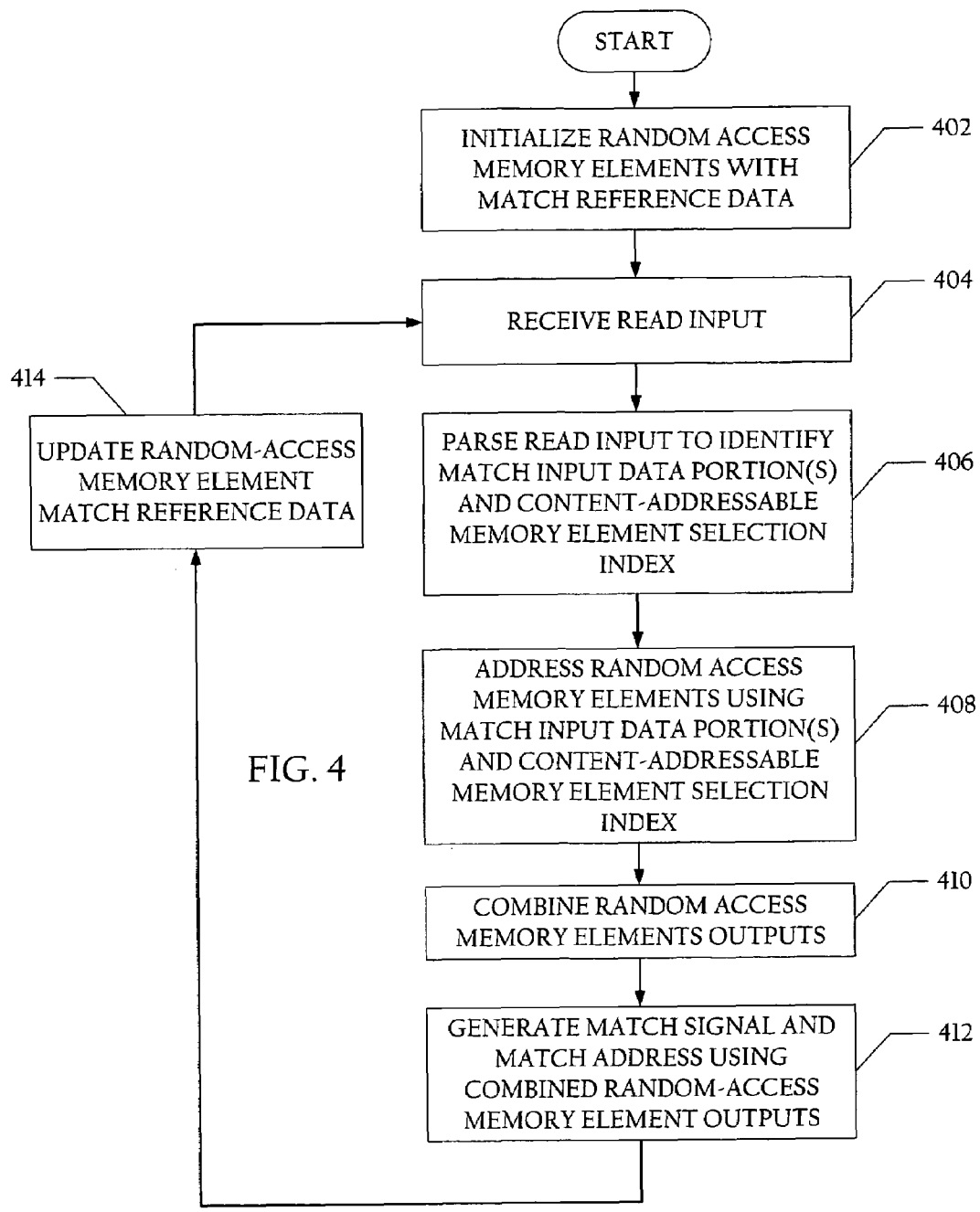
FIG. 4 illustrates a flow diagram of a process for emulating a read operation on a plurality of content-addressable memory elements according to an embodiment of the present invention.

FIG. 4 illustrates a flow diagram of a process for emulating a read operation on a plurality of content-addressable memory elements according to an embodiment of the present invention. Although the flow diagram depicted in FIG. 4 indicates a particular order of operation and a specific granularity of process operations, in alternative embodiments the illustrated order may be varied (e.g., process operations may be performed in another order or performed substantially in parallel with one another) and one or more of the process operations may be coalesced or fragmented. Similarly, additional process operations may be added or eliminated where necessary in alternative embodiments of the present invention.

In the illustrated process embodiment, RAM elements used to emulate a plurality of CAM elements are first initialized with match reference data (process block 402). Once initialization is complete, a read input (e.g., a data processing system memory address or portion thereof) is received (process block 404). According to alternative embodiments of the present invention, such input data may be provided to a cache controller element or directly applied to an input or read port of an emulated CAM element (e.g., emulated CAM 300 of FIG. 3). Thereafter, the received read input is parsed to identify match input data (e.g., cache tag) portions and a CAM element selection (e.g., cache set) index (process block 406).

Once the received read input has been parsed, each of a number of associated RAM elements is addressed using the CAM selection index along with a corresponding portion of the identified match input data (process block 408). According to one embodiment, the described addressing operation is performed by generating a RAM element address via a concatenation of a cache set index with a predetermined number of cache tag bits and applying the generated RAM element address to an associated RAM element read port. As each RAM element is addressed, a RAM element record is identified containing match reference data for analysis to determine whether an applied portion of match input data "matches" (i.e., is consistent with) match reference data within that RAM element.

According to one embodiment of the present invention, an identified record may be viewed as a column of bits within a 2-dimensional array including rows corresponding to each way of a set associative cache and columns corresponding to a combination of a cache set index and a portion of a cache tag. An identified record is then output by each of the described RAM elements. The RAM element outputs (e.g., "one-hot" encoded bit vectors) are next combined (process block 410) according to the illustrated process embodiment of FIG. 4, for example, by performing a bit-wise logical AND operation.

Thereafter, the combined RAM element outputs are utilized to generate a match indication signal and, if a match is determined to have occurred for all portions of the received match input data, a match address specifying a location at which the matching data is stored within a CAM element being emulated (process block 412). In one embodiment, a match indication signal is generated by performing a logical addition or "OR" operation on the combined RAM element output. Similarly, in the described embodiment, a match address is formed via encoding, for example, by converting the previously "one-hot" encoded data to a conventional binary representation.

Once the match address and match indication signal have been generated for a received read input, match reference data within the RAM elements comprising an associated emulated CAM may be updated (process block 414) if appropriate, before another read input is received for processing as shown. In one embodiment of the present invention, a match reference data update is performed by first erasing or "clearing" an existing "one-hot" encoded bit (identifying the storage location of the data being read) and subsequently writing or "setting" another bit within the RAM element as appropriate. In another embodiment, data identifying previously-stored match reference data is stored within a separate RAM element and used to identify which bit position is to be cleared at the outset of a match reference data update operation.

While described primarily herein with respect to operation with a data processing system processor cache (e.g., a cache tag lookup operation) embodiments of the present invention are applicable to a number of CAM element-based search intensive functions. For example, embodiments of the present invention may be used in conjunction with CAM-based data processing system processor translation lookaside buffers (TLBs), data compression systems, database accelerators, neural networks, and/or communications network elements (e.g., to perform network/Internet Protocol (IP) address translation). Similarly, while fixed or predetermined read input segments or portions have been illustrated and described herein, such elements (e.g., match input data portions and/or CAM element selection indices) may be dynamically determined or identified. For example, in one embodiment, a pool of available RAM elements may be selectively activated as needed to perform a particular CAM function with the sizes of the portions of match input data applied to each RAM element being adjusted accordingly on a dynamic basis. In another exemplary embodiment, predetermined "header" data may be used to dynamically specify the size and locations of a CAM selection index and/or match input data.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention.

Consequently, the invention is intended to be limited only by the scope of the appended claims, giving full cognizance to equivalents in all respects.

What is claimed is:

1. A method for emulating a read operation on a plurality of content-addressable memory elements utilizing a read input, wherein said read input comprises match input data and a content-addressable memory element selection index, said method comprising:

distributing match reference data among a plurality of random-access memory elements, wherein said distributing includes storing match reference data corresponding to each of said plurality of content-addressable memory elements within a first random-access memory element of said plurality of random-access memory elements;

identifying a first record within said first random-access memory element utilizing a first portion of said match input data and said content addressable memory element selection index; and generating a read operation result utilizing said first record;

wherein:

said distributing further includes storing match reference data corresponding to each of said plurality of content-addressable memory elements within a second random-access memory element of said plurality of random-access memory elements, said method further comprises identifying a second record within said second random-access memory element utilizing a second portion of said match input data and said content addressable memory element selection index, and said generating includes generating said read operation result utilizing said first record and said second record.

2. The method of claim 1, wherein said match reference data comprises cache tag match reference data.

3. The method of claim 2, wherein said read input data comprises a data processing system memory address;

said match input data comprises cache tag data of said data processing system memory address; and said content addressable memory element selection index comprises a cache set index of said data processing system memory address.

4. The method of claim 3, wherein said identifying said first record comprises identifying first cache tag match reference data of said cache tag match reference data within said first random-access memory element, said identifying said second record comprises identifying second cache tag match reference data of said cache tag match reference data within said second random-access memory element, and said generating said read operation result utilizing said first record and said second record comprises logically combining said first cache tag match reference data and said second cache tag match reference data.

5. The method of claim 3, wherein said generating said read operation result comprises generating a cache tag lookup result and said method further comprises accessing a cache memory element utilizing said cache tag lookup result.

* * * * *